(12) United States Patent
Grund

(10) Patent No.: US 7,397,253 B2
(45) Date of Patent: Jul. 8, 2008

(54) TRANSMISSION LINE PULSE (TLP) SYSTEM CALIBRATION TECHNIQUE

(76) Inventor: Evan Grund, 5932 Amapola Dr., San Jose, CA (US) 95129

( * ) Notice: Subject to any disclaimer, the term of this patent is extended or adjusted under 35 U.S.C. 154(b) by 0 days.

(21) Appl. No.: 11/784,487

(22) Filed: Apr. 6, 2007

(65) Prior Publication Data

US 2007/0236210 A1    Oct. 11, 2007

Related U.S. Application Data

(60) Provisional application No. 60/790,473, filed on Apr. 7, 2006.

(51) Int. Cl.
*G01R 27/26* (2006.01)
(52) U.S. Cl. .......................... 324/676; 702/85; 324/765
(58) Field of Classification Search ......... 324/676–678, 324/765; 702/85
See application file for complete search history.

(56) References Cited

U.S. PATENT DOCUMENTS 6,429,674 B1 * 8/2002 Barth et al. ................. 324/763
6,943,578 B1 * 9/2005 Sanda et al. ................. 324/765
2007/0159186 A1 * 7/2007 Grund ........................ 324/678

* cited by examiner

*Primary Examiner*—Ha Tran Nguyen
*Assistant Examiner*—Arleen M. Vazquez
(74) *Attorney, Agent, or Firm*—Nixon Peabody LLP

(57) ABSTRACT

A transmission Line Pulse (TLP) device calibration method wherein the TLP device includes a pulse generator for generating a pulse, a cable having an input terminal coupled to said pulse generator, an output terminal, and at least one ground return terminal, for coupling said pulse to a device under test (DUT) when it is connected to said output terminal, and a sensor for sensing the voltage and current at a selected point in said cable to measure the pulsed voltage and current of the DUT as the pulses travel in the cable to and from the DUT. The method for calibrating said TLP device comprises selectively shorting between said output terminal and said ground return terminal and selectively creating an open circuit between these terminals to enable the calculation of the series resistance $R_S$ at said selected point in said cable and calculating the shunt resistance $R_{SH}$ at said selected point in said cable, respectively, when a pulse is generated, and for calculating the corrected values of current and voltage according to a formula that uses these resistance values.

4 Claims, 5 Drawing Sheets

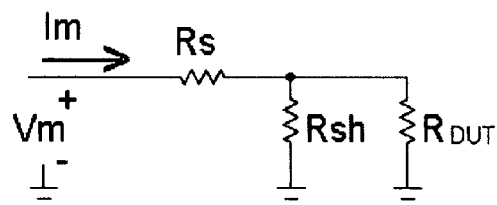
Fig. 2A
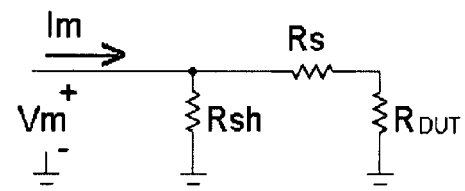
Fig. 2B
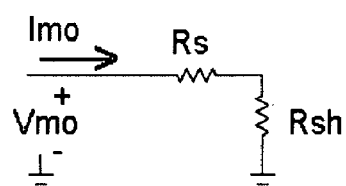
Fig. 2C
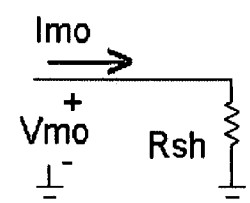
Fig. 2D
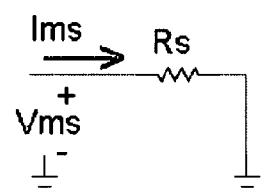
Fig. 2E
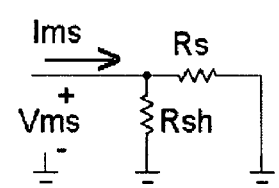
Fig. 2F
Fig. 2  Prior Art

TRANSMISSION LINE PULSE (TLP) SYSTEM CALIBRATION TECHNIQUE

CROSS REFERENCE TO RELATED APPLICATION

This application claims the benefit of U.S. Provisional Application No. 60/790,473, filed Apr. 7, 2006, which is incorporated herein by reference.

BACKGROUND OF THE INVENTION

1. Field of the Invention

This invention relates generally to testing systems of integrated circuits and in particular to transmission line pulse systems and devices.

2. Description of the Related Art

Measurement of integrated circuit (IC) short pulse response is often made using Transmission Line Pulse (TLP) techniques as described in the ESD Association industry document ANSI/ESD SP5.5.1-2004 and U.S. Pat. No. 5,519,327. These documents describe the technique for measuring the response of a device under test (DUT) when pulses are coupled to the DUT. The technique comprises comparing the pulse that is received at the DUT with the reflected pulse from the DUT. The relative amplitudes of these pulses are controlled by the dynamic impedance of the DUT. Studies of DUT responses to short, high power pulses is a common goal of electrostatic discharge (ESD) studies.

In a TLP device, pulses are carried in a constant impedance cable between the pulse generator and the DUT to avoid pulse distortions. It is common to measure the current and voltage pulse waveforms in the cable connected to the DUT. Since these measurements are not exactly made at the DUT, some error is introduced by the interconnecting cable. ESDA/ANSI STM 5.5-HBM prescribes that such measurement distortions are to be measured using open circuit and short circuit test loads to enable the raw data to be corrected for these systemic errors.

The prior art method of TLP corrections is described in section 7 of the ESD Assoc. ANSI/ESD SP5.5.1 document. This document defines procedures including:

7 Test Requirements and Procedures 7.1 Error Correction

Adjustments of both current and voltage measurements are important to remove unavoidable non-ideal system characteristics such as system resistance, contact resistances, and shunt resistance. Periodic verification using simple components with known properties insures accurate measurements.

7.2 Tester Error Correction Methodology

Perform the error correction methodology, including the open and short circuit measurements, at least once per shift or when the equipment is modified or changed. Longer periods between error correction steps may be used if no changes in the error correction factors are observed for several consecutive checks. Create a separate set of adjustment values for each test pulse rise time, or configuration of cables and probes used to collect device data. The adjustments derived from the short circuit and open circuit measurements may be applied to the data within the operating system software, during post processing using spreadsheet or other data analysis software or can be done manually. To insure accurate results, all measurements should be performed on properly calibrated measurement instruments.

7.2.1 Error Correction Short Circuit Methodology

Measurements through a short circuit allow for correction of system and contact resistance.

7.2.1.1 Connect an electrical short circuit to the end of the device testing connections or needles at the DUT. In the case of wafer probes, placing probe needles on a low resistance clean metal can be considered as a good electrical short circuit. The short circuit should be made of the same type of material to be used during device measurements or verification, and should be verified by standard low resistance measurement techniques with accuracy to 1 m $\Omega$.

7.2.1.2 Perform a TLP test (see section 7.4 for test procedure) with at least 5 points set to the maximum current. If the slope of a line through the test points is not 0 $\Omega$, then the value of the slope of the line in V/A ($\Omega$) represents the internal adjustment value and should be used to correct the DUT I-V test data.

7.2.1.3 Record the measured V/A values for reference and use until the next short circuit error correction.

7.2.1.4 For the greatest accuracy, use an I-V plot range of +/−1V with the current range set to highest value used in the TLP system.

7.2.2 Error Correction Open Circuit Methodology

Measurements through an open circuit allow the correction of shunt resistance contributions.

7.2.2.1 Provide an open circuit at the end of the device testing connections for a socket tester. For wafer probing, disconnecting the probe needles from the short circuit will provide an optimum open circuit.

7.2.2.2 Perform a TLP test (see section 7.4 for test procedure) with at least 5 points set to the maximum voltage. If the slope of a line through the test points is not infinite, then the value of the slope of the line represents the internal adjustment value and should be used to correct the DUT I-V test data.

7.2.2.3 Record the measured A/V values for reference and use until the next open circuit error correction.

7.2.2.4 For the greatest accuracy, use an I-V plot range of +/−10 mA with the voltage range set to the highest value used for device testing.

Note 2: Typically the current probe losses inject 1 ohm into the current carrying wire, thus the total V/A correction will be greater than 1 $\Omega$. VF-TLP test leads running to a wafer probe station can add an additional 1 $\Omega$ to the V/A error correction. Therefore, the V/A error correction can be approximately 1 $\Omega$ for socket testing and 1 to 2 $\Omega$ for wafer testing. Unless a voltage probe with a lower resistance provides greater shunt losses, the A/V error correction will vary in the 10 k $\Omega$ to 100 k $\Omega$.

7.3 Tester Verification Methodology

Verification of TLP test system accuracy should be performed on a regular basis and prior to system use to minimize error in the measurements. The verification procedure and methodology is dependent on the TLP method being utilized. Verification is performed using both a Zener diode and a resistor. The Zener diode is used to verify the system voltage error. Once the voltage error is known, a resistor is used to verify the system current error.

7.3.1 Choose a Zener diode. Measure the dc reverse bias breakdown voltage.

7.3.2 Perform a reverse bias TLP test (see section 7.4) on the Zener diode to a voltage above the Zener diode reverse bias breakdown voltage. Compare the VF-TLP and dc breakdown voltage.

7.3.3 Choose a resistor whose resistance value is comparable to the DUT resistance. Typical DUT resistances are between 1 and 50 Ω. Measure the resistance to within 10 mΩ. A four-wire (Kelvin) technique removes contact resistance from the measurement. For a socket system, insert the resistor into the test socket. For a wafer probing system, place the probe needles on the electrical terminals of the resistor element.

7.3.4 Perform a TLP I-V measurement (see section 7.4 for test procedure). The number of voltage steps should be chosen to minimize measurement error relative to the average resistance straight-line slope. Use the V/A and A/V error correction results to correct for system, contact, and shunt resistance.

7.3.5 After the test completion, calculate the V/A ratio (e.g., slope). Compare the calculated resistance and measured dc resistance. The difference is a measure of the amount of error in the TLP measured resistance. Given that the measured voltage has been found to be accurate (e.g., based on the Zener diode measurement), a determination of current measurement accuracy can be obtained by comparing the measured and calculated current. This is based on the measured voltage divided by the known resistance value.

7.3.6 Perform the resistance measurement for each rise time and cable configuration to be used. The accuracy should be approximately the same for each measurement.

The authors of this industry procedure had not studied the interaction of the "open/short correction" and the calibration of the voltage and current measurement components (the inventor is an author of the above procedure). Applying the correction as described will cause a shift in voltage and current calibration. More specifically, when such tests are performed according to prior art techniques, to make a shorted load (a 0 ohm DUT) measure as a short circuit (no DUT voltage) and to make an open load (infinite resistance or 0 siemens conductance) measure as an open circuit (no DUT current), errors are created. An error occurs in the current measurement when adjusting the voltage to properly record a low resistance DUT, and an error occurs in the voltage measurement when adjusting the current measurement to correctly record a high resistance.

As requirements for measurement accuracy increase, a method of providing open/short corrections without causing shifts in voltage and current calibrations is needed. A new correction technique is needed that will allow open/short corrections without changing the voltage and current calibration.

Therefore, in general, a need exits in the art of TLP systems and devices for testing the ESD protection structures for integrated circuits to improve measurement accuracies by making measurement corrections that do not introduce calibration errors.

SUMMARY OF THE INVENTION

Accordingly, it is an object of the present invention to provide improved measurement accuracy in the Transmission Line Pulse (TLP) systems and devices for testing integrated circuits, specially the electrostatic discharge (ESD) protection structures on connections to such electronic parts. The present invention enables TLP device current and voltage measurements to be corrected without adding error introduced by the voltage and current calibrations of the TLP system. Discharge transmission line pulse (TLP) is a device that tests the response of a device under test (DUT) to a high voltage test pulse, wherein the TLP device includes a pulse generator for generating a pulse, a cable having an input terminal coupled to said pulse generator, an output terminal, and at least one ground return terminal, for coupling said pulse to the DUT when it is connected to said output terminal, and a sensor for sensing the voltage and current at a selected point in said cable. The method for calibrating said TLP device includes measuring known loads and using the computation abilities of the measurement subsystem to apply mathematical algorithms to the measurement data thereby translating the raw data to corrected data that more accurately represents the DUT current and voltage.

Broadly stated, the present invention is a method for calibrating an electrostatic measurement system which comprises selectively shorting between said output terminal and said ground return terminal and generating a pulse having a selected voltage and calculating the series resistance $R_S$ at said selected point in said cable using the formula $$R_S = \frac{V_{ms}}{I_{ms}}$$

where $V_{ms}$ and $I_{ms}$ are the measured voltage and current respectively at said selected point in said cable; selectively creating an open circuit between said output terminal, and said ground return terminal and generating a pulse having a selected voltage and calculating the shunt resistance $R_{SH}$ at said selected point in said cable using the formula $$R_{SH} = \frac{V_{mo}}{I_{mo}}$$

where $V_{mo}$ and $I_{mo}$ are the measured voltage and current respectively at said selected point in said cable; and calculating corrected pulse current $i_c$ and voltage $v_c$ values from measured pulse current $i_m$ and voltage $v_m$ values obtained when a DUT is being tested by using the formulas:

$$v_c = a_{11} \cdot v_m + a_{12} \cdot i_m$$

$$i_c = a_{21} \cdot v_m + a_{22} \cdot i_m$$

where $a_{11}=1+R_S/R_{SH}$, $a_{12}=-R_S$, $a_{21}=-1/R_{SH}$, and $a_{22}=1+R_S/R_{SH}$.

In an alternate embodiment, the corrected pulse current $i_c$ and voltage $v_c$ values are calculated by using the formulas:

$$v_c = a_{11} \cdot v_m + a_{12} \cdot i_m$$

$$i_c = a_{21} \cdot v_m + a_{22} \cdot i_m$$

where $a_{11}=1+R_S/R_{SH}-d \cdot R_S/R_{SH}$, $a_{12}=-R_S$, $a_{21}=-1/R_{SH}$, and $a_{22}=1+d \cdot R_S/R_{SH}$, and $$d = \sqrt{\frac{\left(\frac{v_m}{i_m} - R_{SH}\right)^2 (R_S + Z_{TLP})^2}{\left(\frac{v_m}{i_m} + Z_{TLP}\right)^2 (R_S - R_{SH})^2}},$$

and where $Z_{TLP}$ is the impedance of the TLP system.

These and other objects, features and advantages of the present invention will no doubt become apparent to those skilled in the art after reading the following detailed description of the preferred embodiments that are illustrated in the several accompanying drawings.

BRIEF DESCRIPTIONS OF THE DRAWINGS

The present invention can be better understood with reference to the following drawings, which are incorporated in and form a part of this specification, and, together with the description, serve to explain the principles of the present invention. The components within the drawings are not necessarily to scale relative to each other, emphasis instead being placed upon clearly illustrating the principles of the present invention.

FIGS. 2A-2F illustrate circuit model diagrams of the cable losses incurred when measuring using the circuit of FIG. 1 along with resulting equivalent circuits when either open circuit testing or short circuit testing is being performed;

DETAILED DESCRIPTION OF THE PREFERRED EMBODIMENTS

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention. Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
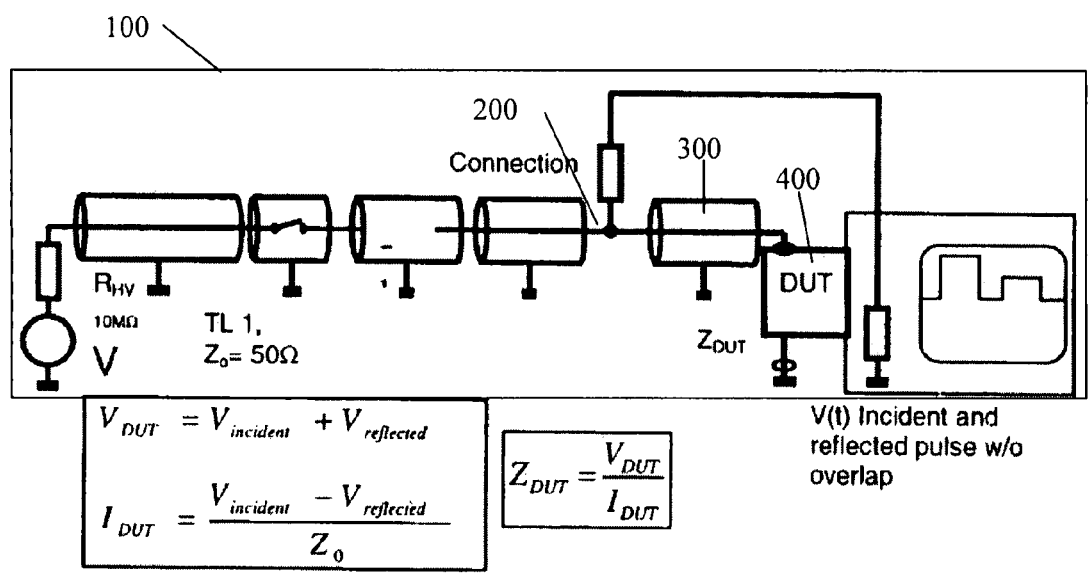
FIG. 1 is a schematic functional diagram of a transmission line pulse test device for testing the integrated circuits that includes the measurement voltage and current signal measurements that are made through a cable connected to the DUT as described in prior art ANSI/ESD SP5.5.1.

As shown in FIG. 1, a transmission line pulser, 100, is designed to measure the impedance of the DUT, 400, with voltage and current monitors placed at position 200 which is separated from the DUT by a cable, 300. Without corrections the measurements of the DUT will have errors induced by the resistance of the interconnecting cable. Resistances of connections to the DUT including its ground return also add to the errors. Especially if an IC wafer DUT is under test, the probe contact resistances of IC wafer DUTs add to the errors. Other errors that can be modeled as series and shunt cable resistances include the loading effects of the current and voltage probes themselves, oscilloscope zero offsets and small impedance changes in the cables and connections. The effects of all such error sources are dealt with in the prior art by measuring an open circuit test load and a short circuit test load, and by adjusting the TLP device's measured results for a DUT under test to provide corrected results where the open circuit current is zero and the short circuit voltage is zero. This is commonly known to those trained in the art as open and short circuit error corrections. It is a common practice to repeat these corrections on a daily basis or whenever the cable or connections to the DUT are changed. This correction should be differentiated from voltage and current calibrations which are gain adjustments so that measured voltages and currents agree with known standards such as NIST traceable secondary standards. It is a common practice to those trained in TLP device operation to make open and short circuit error corrections followed by verifying the calibration or making a new calibration of the voltage and current measurement system reference using known test loads such as Zener diodes or precision resistors. As will be explained, the open and short circuit error corrections of the prior art cause errors in the voltage and current calibrations, such that if a TLP system is calibrated after a first open circuit sand short circuit error correction, then a subsequent open circuit and short circuit error correction operation may cause the voltage and current calibrations to be incorrectly modified. It is a purpose of the present invention to produce an open circuit and short circuit error correction operation that does not impact the voltage and current calibration. It is a common practice in TLP measurements to define the series resistance (aka $R_{SERIES}$ or $R_S$) as the voltage to current ratio measured with a short circuit DUT, and to define the shunt resistance (aka $R_{SHUNT}$ or $R_{SH}$), or the shunt conductance (the reciprocal of the shunt resistance), as the ratio of voltage to current measured when the DUT is an open circuit (zero ohms). These terms are further explained in FIG. 2.

FIGS. 2A and 2B diagram two possible simple circuit models for finding the effective "Series Resistance, Rs" and "Shunt Resistance, Rsh" from measuring open and short circuit test loads. Note that the series and shunt resistances in these two circuit models differ only as to the placement order of these resistances. Since each of these models is also used to correct to errors outside the cable 300, and are not expected to be actual physical lumped circuit elements, each model is equally valid, and both are approximations. FIGS. 2C and 2D illustrate the model circuits in an open circuit test mode where RDUT is removed (infinite resistance). In other words, upon measuring an open circuit test load, the circuit models in FIGS. 2A and 2B are reduced to the circuits in FIGS. 2C and 2D, respectively. In FIG. 2D, Rsh is directly measured, while in FIG. 2C the combination of Rs and Rsh is measured. Similarly, FIGS. 2E and 2F illustrate the model circuits in an short circuit test mode where RDUT is a short (zero resistance). In other words, the short circuit load measurement produces reduced circuit models from the circuits in FIGS. 2A and 2B, shown in FIGS. 2E and 2F, respectively, that are different, with the circuit in FIG. 2E measuring Rs directly and the circuit in FIG. 2F measuring a combination of Rs and Rsh. It is a common practice in TLP corrections to assume the simpler of the models and use the circuit in FIG. 2D when calculating the open circuit parameter Rsh and to use the circuit in FIG. 2E when calculating the short circuit parameter Rs. As the following equations show, this simplification is not entirely correct. Equations:

| From the circuit in FIG. A: | From the circuit in FIG. B: |
|---|---|
| $V_C = V_M - I_M \cdot R_S$ | $I_C = I_M - V_M/R_{SH}$ |
| $I_C = I_M - V_C/R_{SH}$ | $V_C = V_M - I_{DC} \cdot R_S$ |
| $= I_M - (V_M - I_M \cdot R_S)/R_{SH}$ | $= V_M (I_M - V_M/R_{SH}) \cdot R_S$ |
| $= I_M - V_M/R_{SH} - I_M \cdot R_S/R_{SH}$ | $= V_M - I_M/R_S - V_M \cdot R_S/R_{SH}$ |
| Given $R_S \ll R_{SH}$, we find | Given $R_S \ll R_{SH}$, we find |
| $I_C \approx I_M - V_M/R_{SH}$ | $V_C \approx V_M - I_M \cdot R_S$ |

Furthermore, these equations show that if the assumption is made that Rs is much less than Rsh, which is often true, then in the limiting case the results from the two models are identical, and the open and short circuit error corrections become simply:

$$V_C = V_M - I_M \cdot R_S \text{ and } I_C = I_M - V_M/R_{SH}$$

Figure 3:
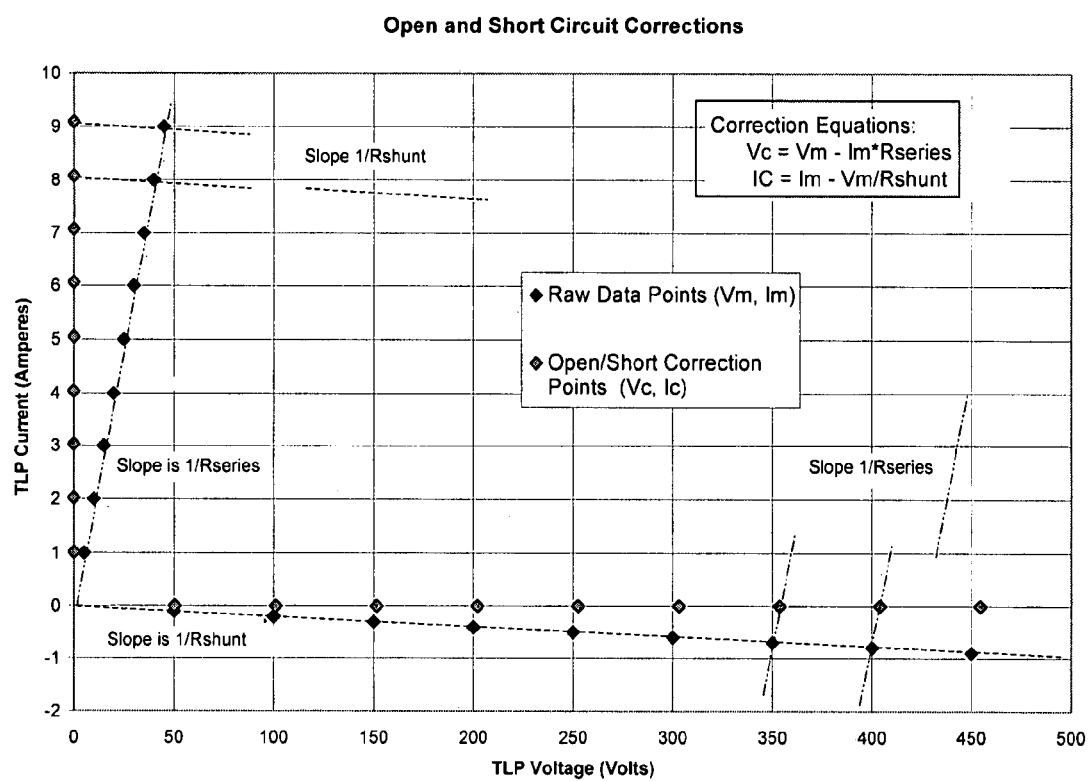
FIG. 3 is a graph of the results of the prior art corrections for the cable losses.

FIG. 3 shows how the equations derived from the circuit models shown in FIG. 2 actually map the measured open circuit points to the voltage axis (where current=0) and the short circuit points to the current axis (where voltage=0). While the desired result of producing corrected measurement points that agree with open and short circuit measurements respectively is obtained, there is also a shift in voltage and current values in the open and short circuit cases respectively. This demonstrates the interaction between the two corrections that is unwanted. If we now apply a voltage and current calibration with voltage and current standards, we can correct the error introduced in voltage and current measurements by the open and short circuit error correction. However, this calibration will be changed if we make a hardware change that requires a different Rsh or Rs to produce a proper open and short circuit correction. This requires a recalibration after each open and short circuit correction, which is not typically done by TLP users. Therefore, TLP measurements often have small errors.

With the advancement of the TLP art, the pulses used for measurement are becoming shorter in width and the voltage and current probes to measure them are less ideal (i.e., they produce more signal loading) and hence the assumption that Rs<<Rsh is becoming less true in practice. This makes the calibration errors introduced by the open and short circuit corrections greater. This is in conflict with the desire to make more accurate measurements, and indicates why there is the need for an improved open and short error correction.

Figure 4:
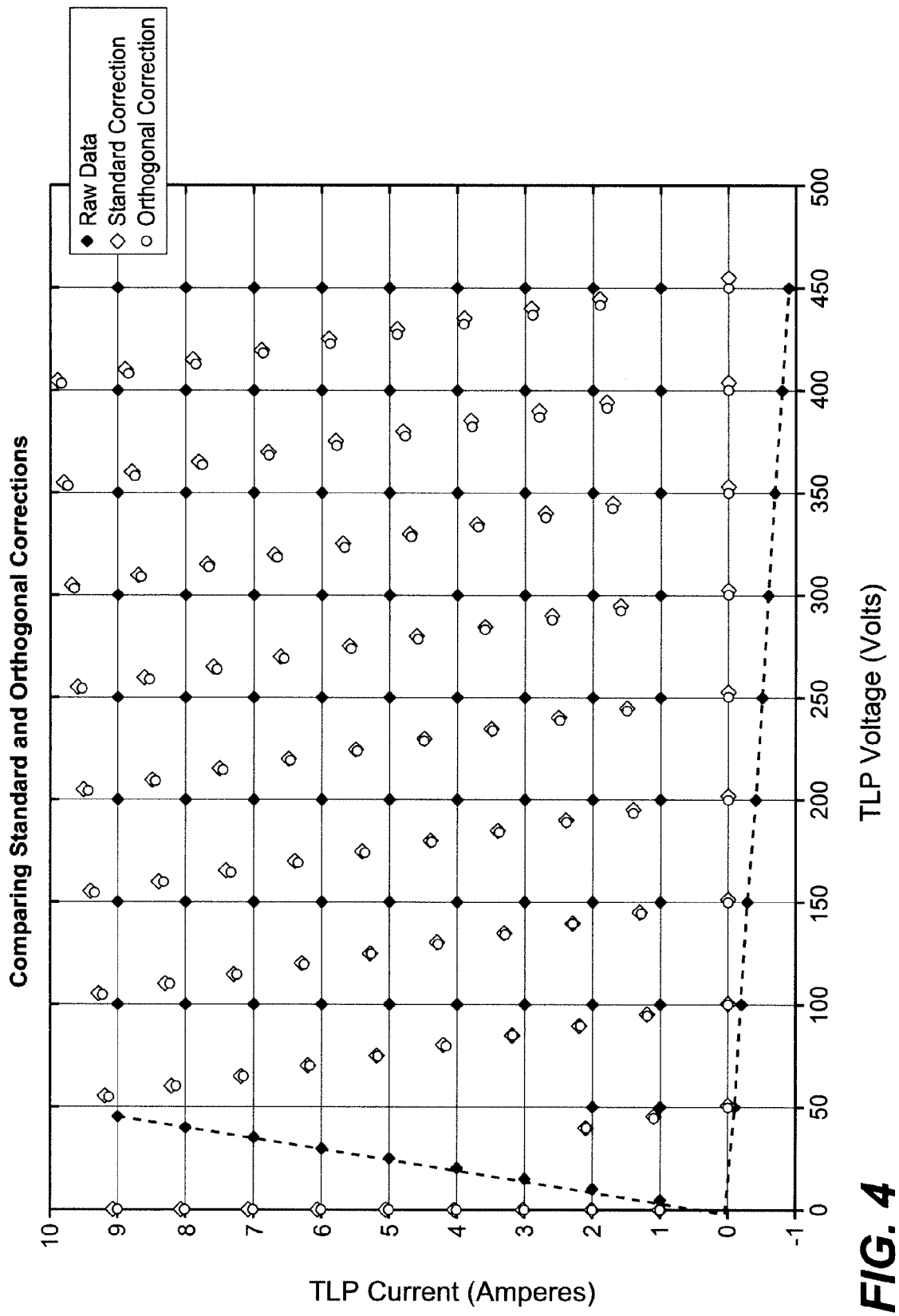
FIG. 4 is a graph of the invented corrections showing the results of the preferred embodiment of the invention.
Figure 5:
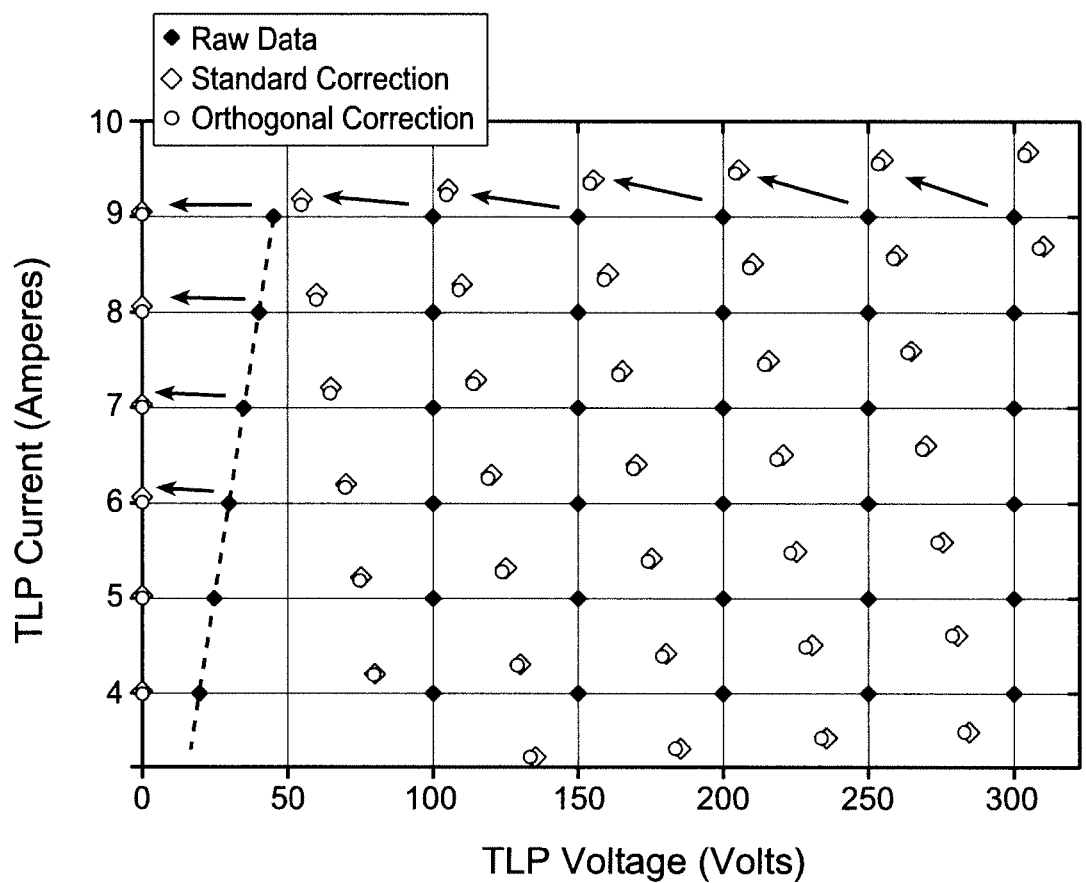
FIG. 5 is a more detailed view of the graph of FIG. 4.

FIG. 4 shows the desired results from a correction that does not change the basic voltage and current calibration. This is accomplished when the correction moves the measured open and short circuit points to the axes in a direction orthogonal to the axes. This is a purpose of the invention. With all open and short circuit corrections moving orthogonally (perpendicular) to the axes, the calibration doesn't change. A grid of points that are not the uncorrected open and short circuit measured points is also shown along with their corrected points are also displayed for completeness. FIG. 5 is a more detailed view of the graph of FIG. 4.

The following first describes the linear algebra equations of prior art and then the equations that are used in the implementation of the improved corrections according to the present invention. With points shown as vectors and corrections as linear transformations, the measured point can be characterized as $$\vec{m} = \begin{bmatrix} v_m \\ i_m \end{bmatrix}$$

and the corrected point characterized as $$\vec{c} = \begin{bmatrix} v_c \\ i_c \end{bmatrix}.$$

The prior art correction is a linear transformation from the measured point to the corrected point using the correction matrix:

$$\vec{c} = \begin{bmatrix} 1 & -Rs \\ \frac{-1}{Rsh} & 1 \end{bmatrix} \vec{m}. \qquad \text{(Equation 1)}$$

According to the present invention, the correction is a linear transformation from the measured point to the corrected point using the following correction matrix:

$$\vec{c} = \begin{bmatrix} 1 + \frac{Rs}{Rsh} & -Rs \\ \frac{-1}{Rsh} & 1 + \frac{Rs}{Rsh} \end{bmatrix} \vec{m}, \qquad \text{(Equation 2)}$$

so that the correction moves open/short circuit points orthogonally relative to the axes and is positioned approximately on one of the axes. The preferred correction moves the open/short circuit points orthogonally relative to the axes and positions them exactly on the axes, where the correction is a linear transformation from the measured point to the corrected point using the following correction matrix:

$$\vec{c} = \begin{bmatrix} 1 + (1-d)\left(\frac{Rs}{Rsh}\right) & -Rs \\ \frac{-1}{Rsh} & 1 + \frac{d \cdot Rs}{Rsh} \end{bmatrix} \vec{m}, \qquad \text{(Equation 3)}$$

where $$d = \sqrt{\frac{\left(\frac{v_m}{i_m} - R_{SH}\right)^2 (R_S + Z_{TLP})^2}{\left(\frac{v_m}{i_m} + Z_{TLP}\right)^2 (R_S - R_{SH})^2}} \text{ and}$$

$Z_{TLP}$ is the TLP System impedance.

The above three equations describe open and short circuit corrections as linear algebra mapping functions taking the uncorrected voltage and current points represented as a vector $$\vec{m} = \begin{bmatrix} v_m \\ i_m \end{bmatrix}$$

and multiplying this vector by the correction matrix. Using the correction mapping matrix of Equation 2, provides a preferred embodiment mapping of the open and short measured vectors (representing the points on the open and short measured lines) to corrected vectors where the mapping is always orthogonal to the axis where the corrected vectors are positioned. This embodiment is orthogonal but does not place the corrected vectors exactly on the axes.

Another preferred embodiment is Equation 3 as it is an orthogonal mapping to the axes and places the points from the open and short circuit lines exactly onto the axes.

From the two different circuit models of FIG. 2, both of which, as mentioned above, are equally valid approximations, it can be seen that there are two slightly different corrections. The actual circuit may have distributed leakage rather than the lumped leakage that is modeled as Rsh at a fixed position in the circuit. As FIG. 2 shows, when the ratio of Rsh to Rs is very large, the error between the two models is small. There is an error introduced by the correction in Equation 1 that has the amount equal to (Rs/Rsh). Equation 2 removes this error by replacing the 1's on the diagonal of the correction matrix with 1+(Rs/Rsh). This now keeps the correction perpendicular to the axes, but now the corrected values will not lie exactly on the axes. The second induced error is removed by Equation 3 which is a linear interpolation of Equations 1 and 2 based on a parameter called d.

An example of the use of the equations in the embodiment that uses a oscilloscope/computer to measure and correct the measurement follows. With a TLP system that has Rs=5 ohms series resistance and Rsh=−500 ohms shunt resistance and a 50 ohm TLP delivery impedance, a short circuit measurement of Im=9A will also measure Vm=45 V due to the series resistance. Since this is a short circuit measurement, we know the actual voltage is 0, not 45V. Applying the prior art corrections of Equation 1, Vc=Vm−Rs*Im=45−5*9=0 and Ic=Im−(1/Rsh)*Vm=9−(−1/500)*45=9.09. In the prior art the voltage was corrected, but a 1% error was made to the current measurement.

In the same system, the correction of Equation 2, Vc=(1+(Rs/Rsh))*Vm−Rs*Im=(1−5/500)*45−5*9=−0.45 and Ic=(1+(Rs/Rsh))*Im−(1/Rsh)*Vm=(1−5/500)*9−(−1/500)*45=9. Now the current has not been changed with the correction, however an error in the voltage has been introduced.

In the same system, the correction of Equation 3, we calculate d which is 1 in this case, and Vc=(1+(1−d)*(Rs/Rsh))*Vm−Rs*Im=(1+0)*45−5*9=−0 and Ic=(1+d*(Rs/Rsh))*Im−(1/Rsh)*Vm=(−5/500)*9−(−1/500)*45=9. Now the current has not been changed with the correction, an there is no error in the voltage.

In the above disclosure, it was assumed that the uncorrected open circuit and short circuit data points always formed a perfectly straight line through the origin (zero voltage and zero current being on the line) of slopes of 1/Rsh and 1/Rs respectively. While often a good approximation, this assumption is not in general true. In practice, the values of Rsh and Rs show a voltage dependence as noted in ANSI/ESD SP5.5.1 section 7.2.2.2 which recommends to "Perform a TLP test . . . set to the maximum voltage." As an improvement to the TLP measurement it is possible to measure Rsh and Rs at many voltages and record Rshi and Rsi for many values of i, an index for changes in TLP voltage pulses. Then when testing over a range of voltages, appropriate Rshi and Rsi can be used. However, as different Rshi and Rsi are used, if their corrections are not orthogonal to the axes, changes in voltage and current calibrations will ensue, resulting in non-linear calibration errors. It is a purpose of this invention to allow multiple voltages for open and short circuit error corrections without inducing calibration errors.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In an electrostatic discharge transmission line pulse (TLP) device for testing the response of a device under test (DUT) to a high voltage test pulse, including a pulse generator for generating a pulse, a cable having an input terminal coupled to said pulse generator, an output terminal, and at least one ground return terminal, for coupling said pulse to the DUT when it is connected to said output terminal, and a sensor for sensing the voltage and current at a selected point in said cable, a method for calibrating said TLP device comprising:

selectively shorting between said output terminal and said ground return terminal, generating a pulse having a selected voltage, and calculating the series resistance $R_S$ at said selected point in said cable using the formula $$R_S = \frac{V_{ms}}{I_{ms}}$$

where $V_{ms}$ and $I_{ms}$ are the measured voltage and current respectively at said selected point in said cable;

selectively creating an open circuit between said output terminal and said ground return terminal, generating a pulse having a selected voltage, and calculating the shunt resistance $R_{SH}$ at said selected point in said cable using the formula $$R_{SH} = \frac{V_{mo}}{I_{mo}}$$

where $V_{mo}$ and $I_{mo}$ are the measured voltage and current respectively at said selected point in said cable; and calculating corrected pulse current $i_c$ and voltage $v_c$ values from measured pulse current $i_m$ and voltage $v_m$ values obtained when a DUT is being tested by using the formulas:

$$v_c = a_{11} \cdot v_m + a_{12} \cdot i_m$$

$$i_c = a_{21} \cdot v_m + a_{22} \cdot i_m$$

where $a_{11} = 1 + R_S/R_{SH}$, $a_{12} = -R_S$, $a_{21} = -1/R_{SH}$, and $a_{22} = 1 + R_S/R_{SH}$.

2. The method of claim 1 wherein the steps of calculating the values of the resistances $R_S$ and $R_{SH}$ are repeated for a multiplicity of pulse voltages, pi, and wherein the step of calculating corrected pulse current $i_c$ and voltage $v_c$ values using values of $R_S$ and $R_{SH}$ include selecting values of $R_S$ and $R_{SH}$ obtained for a pulse voltage pi that is in the range of the pulse voltage being used on the DUT under test.

3. In an electrostatic discharge transmission line pulse (TLP) device for testing the response of a device under test (DUT) to a high voltage test pulse, including a pulse generator for generating a pulse, a cable having an input terminal coupled to said pulse generator, an output terminal, and at least one ground return terminal, for coupling said pulse to the DUT when it is connected to said output terminal, and a sensor for sensing the voltage and current at a selected point in said cable, a method for calibrating said TLP device comprising:

selectively shorting between said output terminal and said ground return terminal and generating a pulse having a selected voltage and calculating the series resistance $R_S$ at said selected point in said cable using the formula $$R_S = \frac{V_{ms}}{I_{ms}}$$

where $V_{ms}$ and $I_{ms}$ are the measured voltage and current respectively at said selected point in said cable;

selectively creating an open circuit between said output terminal and said ground return terminal and generating a pulse having a selected voltage and calculating the shunt resistance $R_{SH}$ at said selected point in said cable using the formula $$R_{SH} = \frac{V_{mo}}{I_{mo}}$$

where $V_{mo}$ and $I_{mo}$ are the measured voltage and current respectively at said selected point in said cable; and calculating corrected pulse current $i_c$ and voltage $v_c$ values from measured pulse current $i_m$ and voltage $v_m$ values obtained when a DUT is being tested by using the formulas:

$$v_c = a_{11} \cdot v_m + a_{12} \cdot i_m$$

$$i_c = a_{21} \cdot v_m + a_{22} \cdot i_m$$

where $a_{11} = 1 + R_S/R_{SH} - d \cdot R_S/R_{SH}$, $a_{12} = -R_S$, $a_{21} = -1/R_{SH}$, and $a_{12} = 1 + d \cdot R_S/R_{SH}$, and $$d = \sqrt{\frac{\left(\frac{v_m}{i_m} - R_{SH}\right)^2 (R_S + Z_{TLP})^2}{\left(\frac{v_m}{i_m} + Z_{TLP}\right)^2 (R_S - R_{SH})^2}},$$

and where $Z_{TLP}$ is the impedance of the TLP system.

4. The method of claim 3 where $Z_{TLP}$ is in the range of between 25 and 500 ohms.

\* \* \* \* \*